(12) United States Patent
Yu

(10) Patent No.: US 6,197,678 B1
(45) Date of Patent: Mar. 6, 2001

(54) DAMASCENE PROCESS

(75) Inventor: Chia-Chieh Yu, Taipei Hsien (TW)

(73) Assignee: United Semiconductor Corp., Hsinchu (TW)

(*) Notice: Subject to any disclaimer, the term of this patent is extended or adjusted under 35 U.S.C. 154(b) by 0 days.

(21) Appl. No.: 09/241,742

(22) Filed: Feb. 1, 1999

(30) Foreign Application Priority Data

Dec. 18, 1998 (TW) .................................... 87121151

(51) Int. Cl.[7] .................................................. H01L 21/4763
(52) U.S. Cl. ........................ 438/627; 438/624; 438/629; 438/633; 438/637; 438/638; 438/643; 438/666; 438/672; 438/687; 438/782
(58) Field of Search .................................. 438/623, 624, 438/626, 627, 629, 631, 633, 637, 638, 643, 653, 666, 668, 672, 675, 687, 780, 782, 787, 790

(56) References Cited

U.S. PATENT DOCUMENTS

| | | | |
|---|---|---|---|
| 5,158,910 | * 10/1992 | Cooper et al. | 438/631 |
| 5,219,787 | * 6/1993 | Carey et al. | 438/637 |
| 5,270,236 | * 12/1993 | Rosner | 438/637 |
| 5,283,208 | * 2/1994 | Lorsung et al. | 438/637 |
| 5,422,309 | * 6/1995 | Zettlet et al. | 438/618 |
| 5,461,004 | * 10/1995 | Kim | 438/671 |
| 5,484,747 | * 1/1996 | Chien | 438/644 |
| 5,518,963 | * 5/1996 | Park | 438/637 |
| 5,616,519 | * 4/1997 | Ping | 438/637 |
| 5,652,182 | * 7/1997 | Cleeves | 438/637 |
| 5,677,243 | * 10/1997 | Ohsaki | 438/637 |
| 5,705,430 | * 1/1998 | Avanzino et al. | 438/618 |
| 5,710,061 | * 1/1998 | Cleeves | 438/618 |
| 5,721,155 | * 2/1998 | Lee | 438/637 |
| 5,801,099 | * 9/1998 | Kim et al. | 438/666 |
| 5,821,164 | * 10/1998 | Kim et al. | 438/637 |
| 5,869,395 | * 2/1999 | Yim | 438/637 |
| 5,888,896 | * 3/1999 | Givens | 438/624 |
| 5,930,672 | * 7/1999 | Yamamoto | 438/637 |
| 6,010,955 | * 1/2000 | Hashimoto | 438/624 |
| 6,033,977 | * 3/2000 | Gutsche et al. | 438/637 |
| 6,037,244 | * 3/2000 | Gardner et al. | 438/637 |
| 6,037,664 | * 3/2000 | Zhao et al. | 257/758 |
| 6,040,243 | * 3/2000 | Li et al. | 438/687 |

OTHER PUBLICATIONS

Wolf et al., Silicon Processing For The VLSI Era, vol. 2: Process Integration, Lattice Press, pp. 214–217 and 229–236, 1990.*

* cited by examiner

Primary Examiner—John F. Niebling
Assistant Examiner—Lynne A. Gurley
(74) Attorney, Agent, or Firm—Jiawei Huang; J. C. Patents

(57) ABSTRACT

A damascene process, applicable to a semiconductor substrate, with a patterned first mask layer formed thereon. A part of the substrate not covered by the first mask layer is exposed, while a first dielectric layer is formed on the exposed part of the substrate. The first mask is then removed to form a first opening in the first dielectric layer. A conformal barrier layer is formed on the substrate and the first dielectric layer, followed by filling the first opening with a metal plug. Alternatively, a dual damascene process is disclosed where a second patterned mask layer is formed in first opening and covers a part of the first dielectric layer, while a part of the first dielectric layer is exposed. A second dielectric layer is formed on the exposed part of the first dielectric layer. The second patterned mask layer is removed to form a second opening and to expose the first opening. Consequently, the conformal barrier layer is formed on the substrate and the dielectric layers, before filling the openings with the metal plug.

24 Claims, 6 Drawing Sheets

DAMASCENE PROCESS

CROSS-REFERENCE TO RELATED APPLICATION

This application claims the priority benefit of Taiwan application serial no. 87121151, filed Dec. 18, 1998, the full disclosure of which is incorporated herein by reference.

BACKGROUND OF THE INVENTION

1. Field of the Invention

The present invention relates to a semiconductor process. More particularly, the present invention relates to a damascene process.

2. Description of Related Art

A damascene process is one kind of interconnect process. The damascene process is to form a trench in a dielectric layer. A metal layer is formed in the trench to form a conductive line as an interconnect. A dual damascene process is one kind of multilevel interconnect process. In the dual damascene process, a contact or a via is additionally formed as an interconnect.

FIGS. 1A through 1C are schematic, cross-sectional views showing a conventional damascene process.

As shown in FIG. 1A, a semiconductor substrate 100 is provided. A dielectric layer 102 is formed over the substrate 100. A chemical-mechanical polishing (CMP) process is performed to planarize the dielectric layer 102. A patterned photoresist layer 104 is formed on the dielectric layer 102.

As shown in FIG. 1B, using the photoresist layer 104 as a mask, the dielectric layer 102 is etched by dry etching to form a trench 106.

As shown in FIG. 1C, the photoresist layer 104 (FIG. 1B) is removed by oxygen plasma. A metal plug 108 is formed in the trench 106, thus completing the damascene process. If a dual damascene process is performed, the process is more complicated.

In the conventional method, oxide with a low dielectric coefficient is used as a material for the dielectric layer 102. The oxide layer includes spin-on polymer (SOP) having a polymer-like structure. While removing the photoresist layer by oxygen plasma, the SOP layer with the polymer-like structure is easily damaged by the oxygen plasma. Therefore, the process is not suitable for removing the photoresist layer by oxygen plasma. Another improved process is to form a cap oxide layer between the dielectric layer and the photoresist layer, as shown in FIGS. 2A through 2B. FIGS. 2A through 2B are schematic, cross-sectional views showing another conventional damascene process. For the convenience of description, the same reference numbers are used in the FIGS. 1A through 1C and FIGS. 2A through 2B to refer to the same or like parts.

As shown in FIG. 2A, a dielectric layer 102 is formed over the substrate 100. A cap oxide layer 103 is formed on the dielectric layer 102. A patterned photoresist layer 104 is formed on the cap oxide layer 103. The cap oxide layer 103 is defined.

As shown in FIG. 2B, the photoresist layer 104 (FIG. 2A) is removed by oxygen plasma. Using the cap oxide layer 103 as a hard mask, the dielectric layer 102 is etched to form a trench 106.

In the conventional method, due to the cap oxide layer 103, the process is more complicated. In addition, while etching the dielectric oxide layer with a low dielectric coefficient to form the trench, a gas with oxygen is commonly used as an etching gas source. The dielectric layer is easily damaged during the etching process. Therefore, the trench profile is not easily controlled and a trench with a bowed profile is often formed. Adhesion between the cap oxide layer and the dielectric oxide layer with a low dielectric layer is poor so that while performing a cleaning step after the etching process, peeling occurs on the cap oxide layer. Moreover, the cap oxide layer formed on the dielectric oxide layer leads to an increased dielectric coefficient for the dielectric layer.

SUMMARY OF THE INVENTION

Accordingly, the present invention provides an improved damascene process. The improved process can simplify conventional processes and does not lead to an increased dielectric coefficient for a dielectric oxide layer. Moreover, the invention is better able to control the shape of an opening profile. Peeling can be avoided while performing a cleaning step after the dielectric layer is etched.

A first embodiment of the invention provides an improved damascene process. A semiconductor substrate is provided. A patterned first mask layer is formed over the substrate. A first dielectric layer is formed on a portion of the substrate exposed by the mask layer. The first mask layer is removed to form an opening in the first dielectric layer. A conformal barrier layer is formed on the substrate and the first dielectric layer. A metal plug is formed in the opening.

According to the second embodiment, the invention provides an improved dual damascene process. A semiconductor substrate is provided. A patterned first mask layer is formed over the substrate. A first dielectric layer is formed on a portion of the substrate exposed by the mask layer. The first mask layer is removed to form a first opening in the first dielectric layer. A patterned second mask layer is formed over the substrate to fill the first opening and to cover a portion of the first dielectric layer around the first opening. A second dielectric layer is formed on a portion of the first dielectric layer exposed by the second mask layer. The second mask layer is removed to form a second opening in the second dielectric layer and to expose the first opening in the first dielectric layer. A conformal barrier layer is formed on the substrate, the dielectric layer, and the second dielectric layer. A metal plug is formed in the first opening and the second opening.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
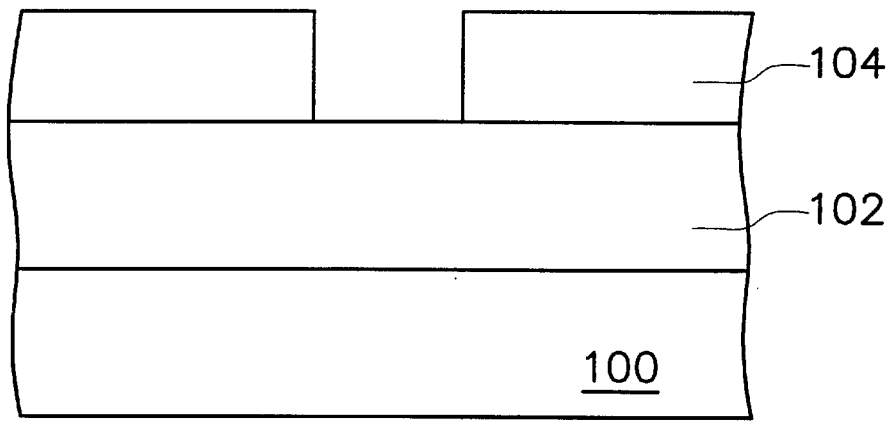
FIGS. 1A through 1C are schematic, cross-sectional views showing a conventional damascene process.
Figure 1B:
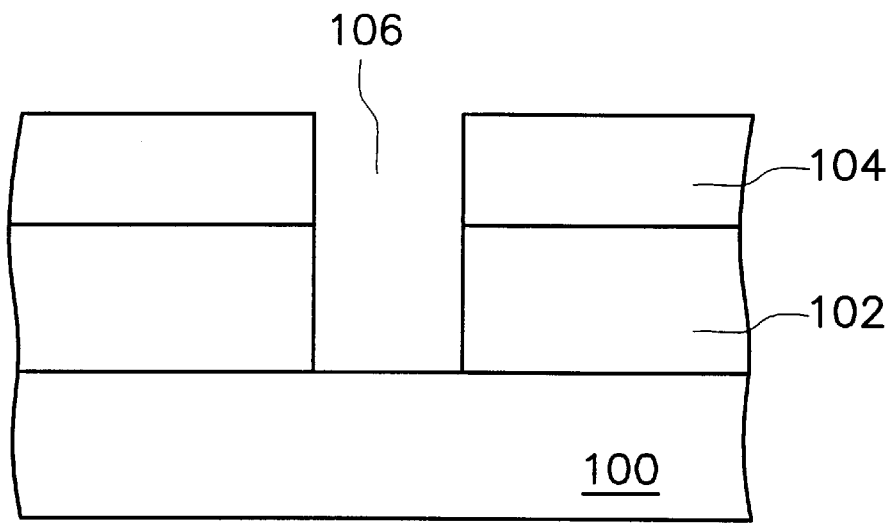
Figure 1C:
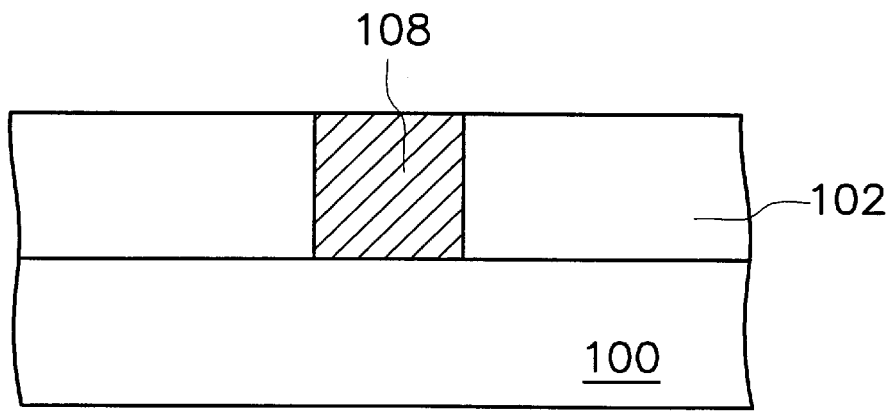
Figure 2A:
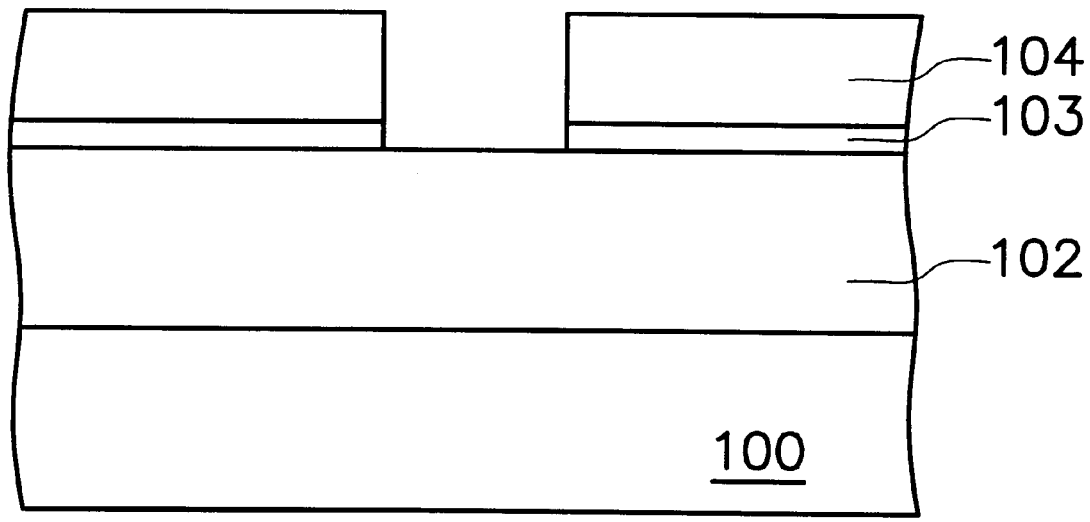
FIGS. 2A through 2B are schematic, cross-sectional views showing another conventional damascene process.
Figure 2B:
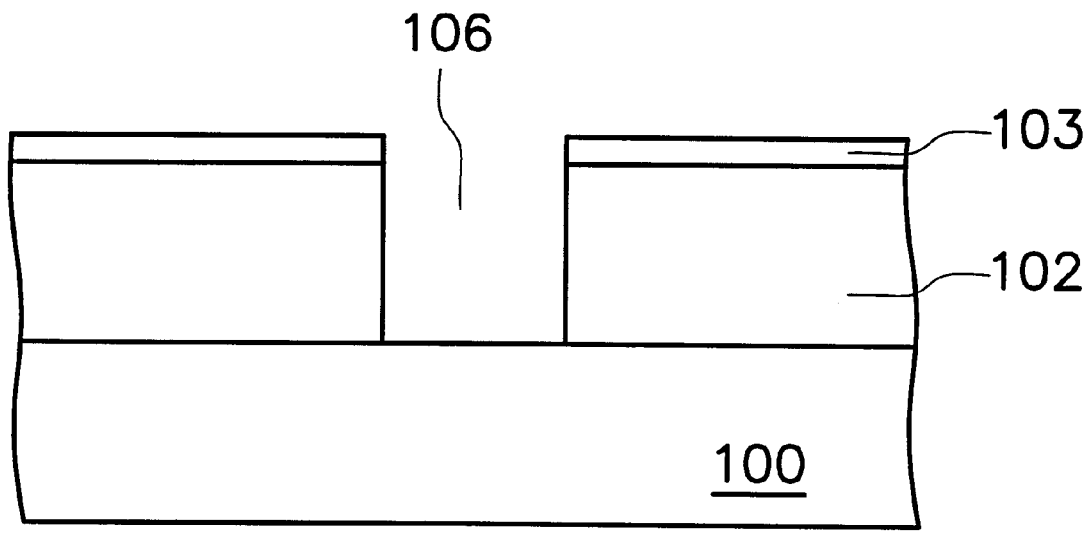

Reference will now be made in detail to the present preferred embodiments of the invention, examples of which are illustrated in the accompanying drawings. Wherever possible, the same reference numbers are used in the drawings and the description to refer to the same or like parts.

The First Embodiment

FIGS. 3A through 3E are schematic, cross-sectional views showing a damascene process according to the first preferred embodiment of this invention.

Figure 3A:
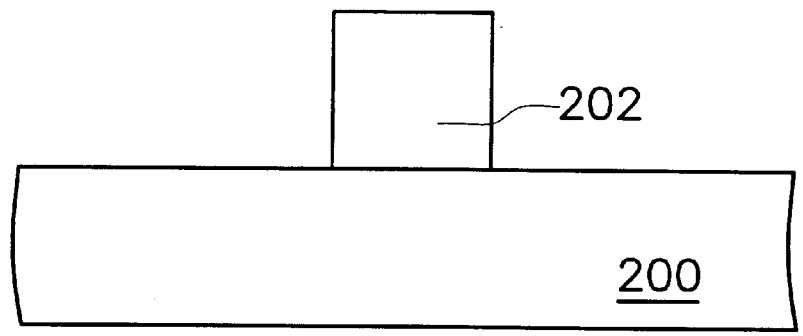
FIGS. 3A through 3E are schematic, cross-sectional views showing a damascene process according to the first preferred embodiment of this invention.

As shown in FIG. 3A, a semiconductor substrate 200 is provided. A patterned mask layer 202 is formed over the substrate 200. The patterned mask layer 202 is positioned on an area in which a required opening is to be subsequently formed. The mask layer 202 includes, for example, a photoresist layer. The method for forming the patterned mask layer 202 includes forming a photoresist layer, and defining the photoresist layer by photolithography and etching.

Figure 3B:
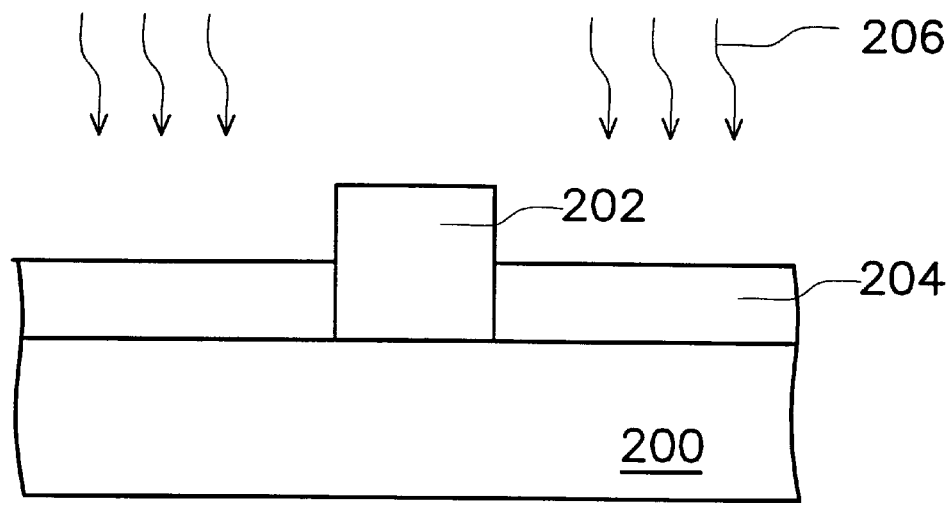

As shown in FIG. 3B, a dielectric layer 204 is formed on a portion of the substrate 200 exposed by the mask layer 202. A thickness of the dielectric layer 204 is the same as a depth of an opening formed subsequently. The dielectric layer 204 is formed, for example, by spin coating. The dielectric layer 204 includes dielectrics with a low dielectric coefficient such as a spin-on polymer (SOP). FLARE produced by Alled-Signal is preferably used as the SOP material. After the SOP layer is formed by spin coating, a curing process is preferably performed to cure the SOP layer. But if the SOP is too severely cured, it is not easy to perform a subsequent planarization process. Therefore, in the invention, the curing process is performed in two steps. After the SOP layer is formed by spin coating, a first partial curing process (arrow 206) is performed at, for example, about 200° C. to cure the SOP layer.

Figure 3C:
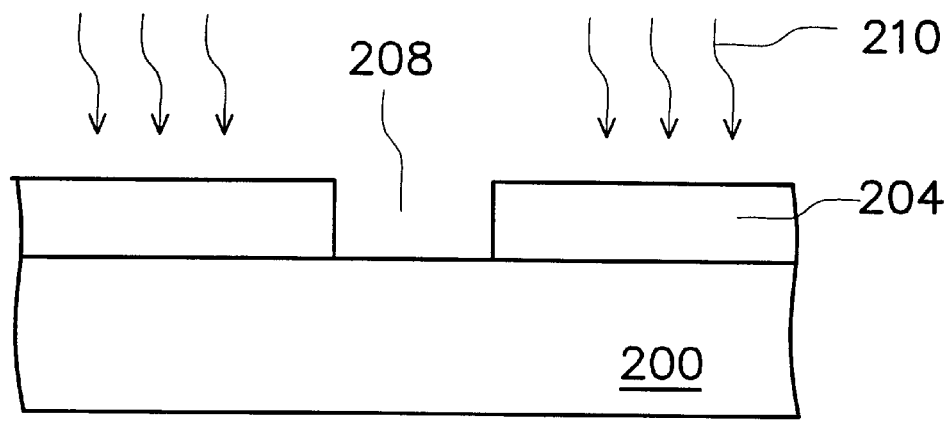

As shown in FIG. 3C, the mask layer 202 (FIG. 3B) is removed to form an opening 208 in the dielectric layer 204. The opening 208 can be a trench, a via hole, or a contact hole. The method for removing the mask layer 202 (FIG. 3B) includes etching and washing the mask layer 202 with oxygen plasma, a reagent having oxygen, or a reagent of 1-methyl-2-pyrrolidine (NMP), for example. A planarization process such as a chemical-mechanical polishing (CMP) process, and is performed to planarize the dielectric layer 204. The planarization process can be performed before the mask layer 204 (FIG. 3B) is removed. A second partial curing process (arrow 210) is performed, for example, at about 400° C. to completely cure the dielectric layer 204.

Figure 3D:
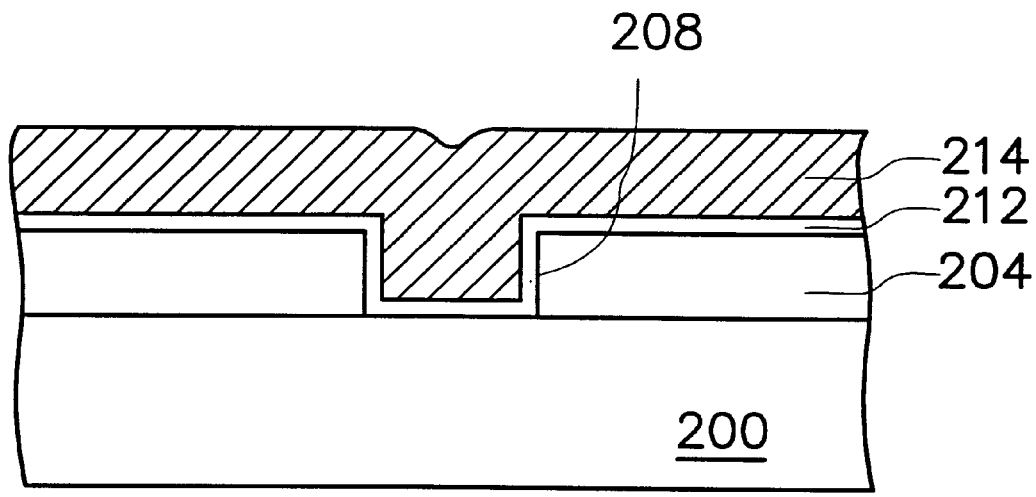

As shown in FIG. 3D, a conformal barrier layer 212 is formed on the substrate 200 and the dielectric layer 204. The barrier layer 212 includes, for example, tantalum nitride (TaN) or tantalum/tantalum nitride (Ta/TaN). The barrier layer 212 is formed, for example, by chemical vapor deposition (CVD). A metal layer 214 is formed over the barrier layer 212 to fill the opening 208. The metal layer 214 includes, for example, copper.

Figure 3E:
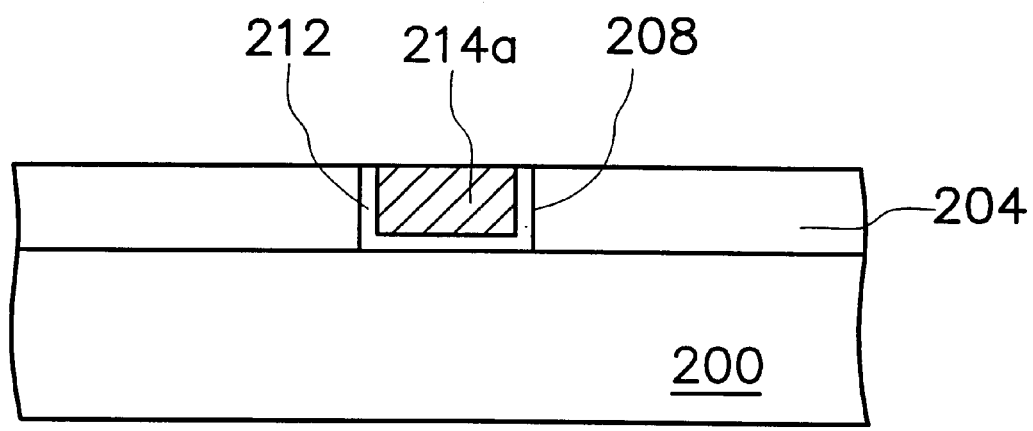

As shown in FIG. 3E, a planarization process is performed to form a plug 214a in the opening 208. The planarization process includes a chemical-mechanical polishing (CMP) process is performed to remove portions of the metal layer 214 and the barrier layer 212 on the dielectric layer 204, using the dielectric layer 204 as a removal stop layer so as to form the plug 214a in the opening 208.

In the invention, a cap oxide layer is not necessarily formed on the dielectric layer, so the processes are thus simplified. In contrast with the conventional method, the invention forms the SOP layer by spin coating after the photoresist layer is formed. Therefore, while removing the photoresist layer, the profile of the opening is easier to control. Moreover, an etching step to form the opening in the conventional method is thus simplified.

Most importantly, the SOP in the invention satisfies several requirements, including:

1. A solvent for the SOP cannot dissolve the photoresist layer.

2. After the first partial curing step, the SOP cannot be dissolved in the cleaning reagent of NMP.

3. The SOP layer can be directly formed on a metal layer.

4. A CMP process can be performed on the SOP layer.

The invention can be used in a dual damascene process, which is described in the second embodiment.

The Second Embodiment

FIGS. 4A through 4E are schematic, cross-sectional views showing a damascene process according to the second preferred embodiment of this invention.

Processes before the opening 208 is formed in the second embodiment are the same as the processes of the first embodiment shown in FIGS. 3A through 3C, so detailed description is omitted here. For the convenience of description, the same reference numbers are used in the first embodiment (FIGS. 3A through 3C) and the second embodiment (FIGS. 4A through 4E) to refer to the same or like parts. In the second embodiment, the opening 208 can be a via hole or a contact hole.

Figure 4A:
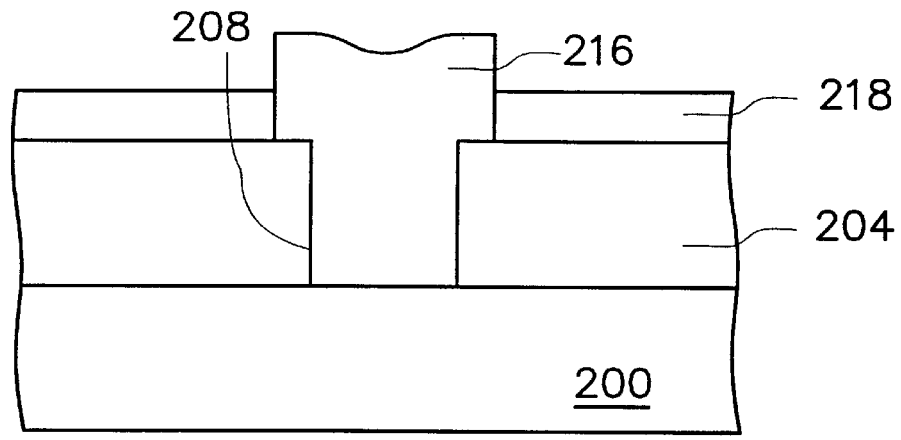
FIGS. 4A through 4E are schematic, cross-sectional views showing a damascene process according to the second preferred embodiment of this invention.

As shown in FIG. 4A, after undergoing the same processes as FIG. 3A through 3C, a cured dielectric layer 204 having an opening 208 is formed on a substrate 200. The opening 208 can be a via hole or a contact hole. A patterned mask layer 216 is formed over the substrate 200 to fill the opening 208 and to cover a portion of the dielectric layer 204 around the opening 208. The position of the mask layer 216 is formed on an area where required interconnects are to be fabricated. The mask layer 216 includes, for example, a photoresist layer. The method for forming the patterned mask layer 216 includes forming a photoresist layer, and defining the photoresist layer by photolithography and etching.

Figure 4B:
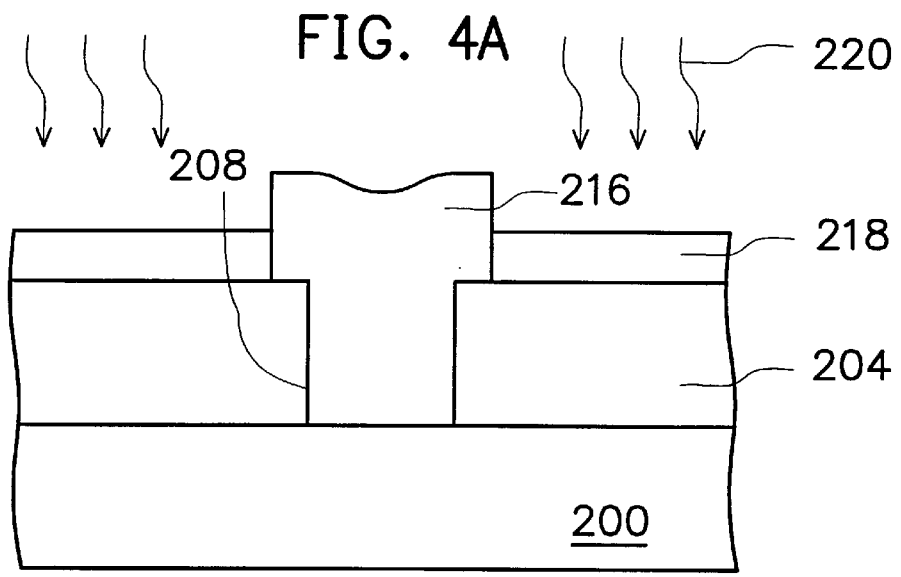

As shown in FIG. 4B, another dielectric layer 218 is formed on a portion of the dielectric layer 204 exposed by the mask layer 216. The dielectric layer 218 is formed, for example, by spin coating. The dielectric layer 218 includes dielectrics with a low dielectric coefficient such as spin-on polymer (SOP). FLARE produced by AlledSignal is preferably used as the SOP material. After the SOP layer is formed by spin coating, a curing process is preferably performed to cure the SOP layer. But if the SOP is too severely cured, it is not easy to perform a subsequent planarization process. Therefore, the curing process is performed in two steps in the invention. After the SOP layer is formed by spin coating, a first partial curing process (arrow 220) is performed to cure the SOP layer, for example, at about 200° C.

Figure 4C:
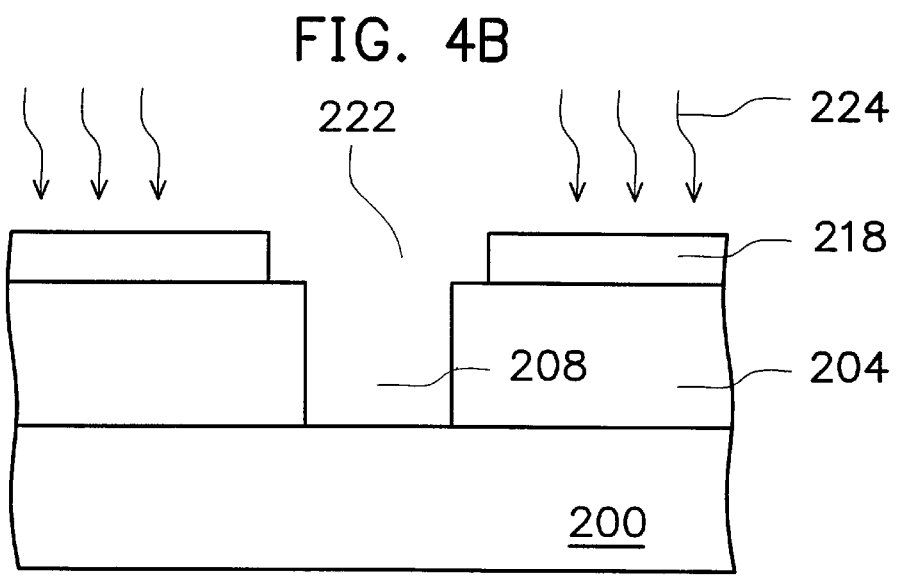

As shown in FIG. 4C, the mask layer 216 (FIG. 4B) is removed to form an opening 222 in the dielectric layer 218 and to expose the opening 208 in the dielectric layer 204. The method for removing the mask layer 202 includes etching and washing the mask layer 202 with oxygen plasma, a reagent having oxygen, or a reagent of 1-methyl-2pyrrolidine (NMP), for example. A planarization process such as a chemical-mechanical polishing process is performed to planarize the dielectric layer 218. The planarization process can be performed before the mask layer 216 (FIG. 4B) is removed. A second partial curing process (arrow 224) is performed at, for example, about 400° C. to completely cure the dielectric layer 218.

Figure 4D:
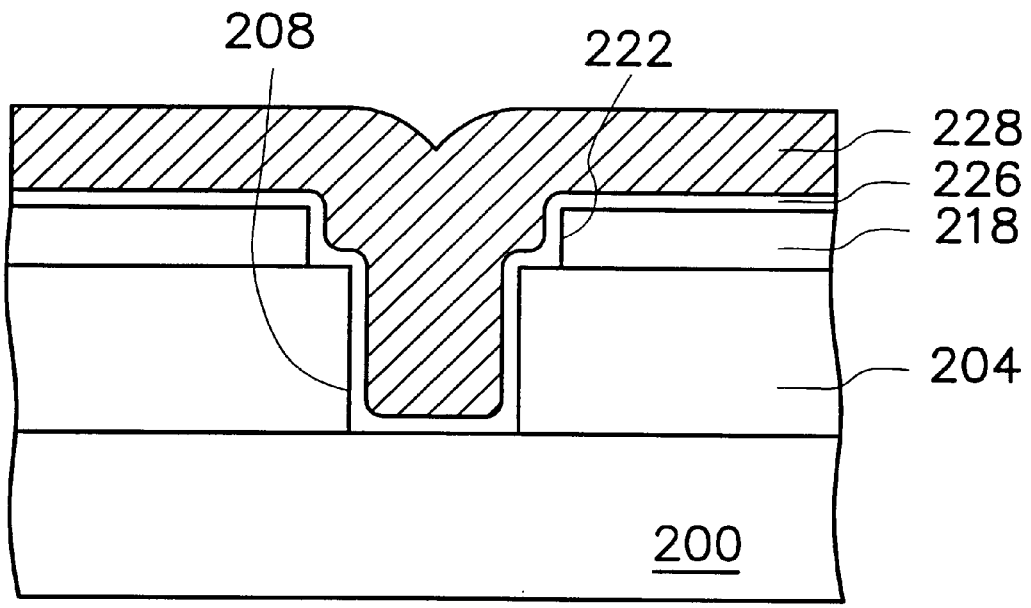

As shown in FIG. 4D, a conformal barrier layer 226 is formed on the substrate 200, the dielectric layer 204, and the dielectric layer 218. The barrier layer 226 includes, for example, tantalum nitride (TaN) or tantalun/tantalum nitride (Ta/TaN). The barrier layer 226 is formed, for example, by chemical vapor deposition (CVD). A metal layer 228 is formed over the barrier layer 226 to fill the opening 222 and the opening 208. The metal layer 228 includes, for example, copper.

Figure 4E:
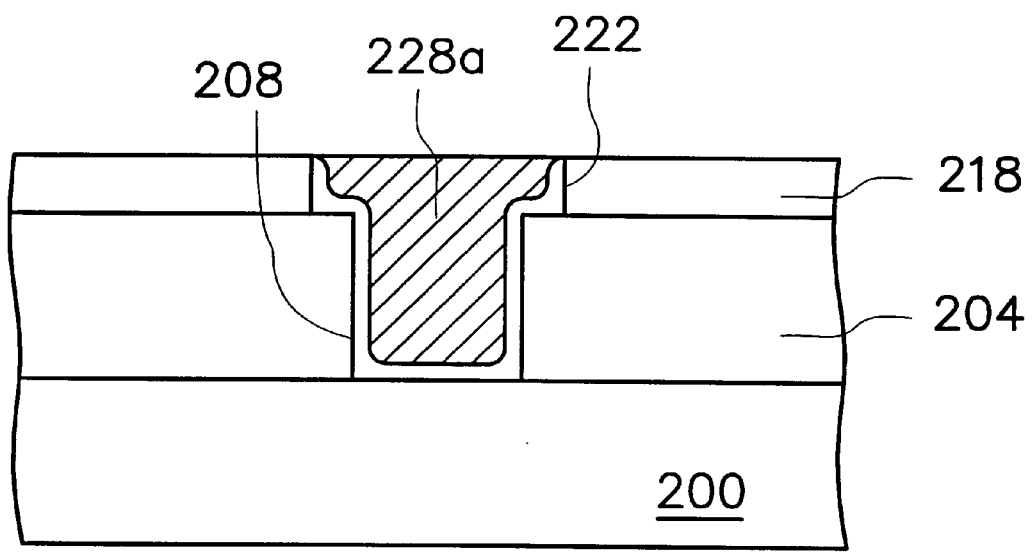

As shown in FIG. 4E, a planarization process is performed to form a plug 228a. The planarization process includes a chemical-mechanical polishing (CMP) process is performed to remove portions of the metal layer 228 and the barrier layer 226 on the dielectric layer 218 using the dielectric layer 218 as a removal stop layer so as to form the plug 228a.

According to the first embodiment and the second embodiment, a cap oxide layer is not necessarily formed. Therefore, the processes are simplified. Moreover, the dielectric coefficient of the dielectric layer is not increased.

The invention forms the SOP layer by spin coating after the photoresist layer is formed. Therefore, while removing the photoresist layer, profile of the opening is easier to control. Moreover, an etching step to form the opening in the conventional method is thus simplified. Peeling can be avoided while performing a cleaning step after the dielectric layer is etched. In the dual damascene process, more than two etching steps for forming the opening are simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A damascene process, comprising:
providing a semiconductor substrate;
forming a patterned mask layer over the substrate;
forming a spin-on polymer layer on a portion of the substrate exposed by the mask layer, wherein an upper surface of the spin-on polymer layer is lower than an upper surface of the mask layer upon formation and the spin-on polymer layer substantially does not cover the upper surface of the mask layer;
removing the mask layer to form an opening in the spin-on polymer layer;
forming a conformal barrier layer on the substrate and the spin-on polymer layer; and
forming a metal plug in the opening.

2. The method according to claim 1, wherein the step of forming the spin-on polymer layer comprising
coating a spin-on polymer layer on the substrate: and
performing planarization using a chemical mechanical polishing process.

3. The method according to claim 2, wherein before the step of planarizing spin-on polymer layer, the method further comprises performing a first partial curing step.

4. The method according to claim 3, wherein the first partial curing step is performed at about 200° C.

5. The method according to claim 3, wherein after the mask layer is removed, the method further comprises performing a second partial curing step.

6. The method according to claim 5, wherein the second partial curing step is performed at about 400° C.

7. The method according to claim 1, wherein the mask layer comprises a photoresist layer.

8. The method according to claim 1, wherein the barrier layer comprises tantalum nitride.

9. The method according to claim 1, wherein the metal plug comprises copper.

10. The method according to claim 1, wherein the step of forming the metal plug comprises:
forming a metal layer over the substrate to fill the opening; and
performing a planarization process to form the metal plug.

11. A dual damascene process, comprising:
providing a semiconductor substrate;
forming a patterned first mask layer over the substrate;
forming a first dielectric layer by spin-coating on a portion of the substrate exposed by the first mask layer wherein said spin-coating is performed to the same depth of a subsequently formed first opening;
removing the first mask layer to form the first opening in the first dielectric layer;
forming a patterned second mask layer to fill the first opening and to cover a portion of the first dielectric layer around the first opening;
forming a second dielectric layer by spin-coating on another portion of the first dielectric layer exposed by the second mask layer wherein said spin-coating is performed to the same depth of a subsequently formed second opening;
removing the second mask layer to form the second opening in the second dielectric layer and to re-expose the first opening in the first dielectric layer;
forming a conformal barrier layer on the substrate, the first and the second dielectric layers; and
forming a metal plug in the first opening and the second opening.

12. The method according to claim 11, wherein the first dielectric layer and the second dielectric layer comprise a spin-on polymer.

13. The method according to claim 12, wherein after the first dielectric layer is formed, the method further comprises performing a first partial curing step to cure the first dielectric layer.

14. The method according to claim 13, wherein the first partial curing step is performed at about 200° C.

15. The method according to claim 13, wherein after the first mask layer is removed, the method further comprises performing a second partial curing step.

16. The method according to claim 15, wherein the second partial curing step is performed at about 400° C.

17. The method according to claim 11, wherein after the second dielectric layer is formed, the method further comprises performing a third partial curing step.

18. The method according to claim 17, wherein the third partial curing step is performed at about 200° C.

19. The method according to claim 17, wherein after the second mask layer is removed, the method further comprises performing a fourth partial curing step.

20. The method according to claim 19. wherein the fourth partial curing step is performed at about 400° C.

21. The method according to claim 11, wherein the barrier layer comprises tantalum nitride.

22. The method according to claim 11, wherein the metal plug comprises copper.

23. A damascene process on a semiconductor substrate, comprising the sequential steps of:

forming a patterned mask layer over the semiconductor substrate;

forming a spin-on polymer layer on a portion of the substrate exposed by the mask layer wherein siad spin-on polymer is formed to the same depth of a subsequently formed opening;

performing a first partial curing on the spin-on polymer layer at a first temperature;

removing the mask layer to form an opening in the spin-on polymer layer;

planarizing the spin-on polymer layer using a CMP process;

performing a second curing on the spin-on polymer layer at a second temperature higher than that of the first partial curing.

24. The damascene process of claim 23, wherein the spin-on polymer comprises fluorinated poly(aryleneether) (FLARE™).

* * * * *